(12) United States Patent
Xiong et al.

(10) Patent No.: US 10,784,678 B1
(45) Date of Patent: Sep. 22, 2020

(54) DAMPED PI-TYPE FILTER Y-TYPE CAPACITANCE NETWORK FOR RADIATED AND CONDUCTED EMISSION

(71) Applicant: Universal Lighting Technologies, Inc., Madison, AL (US)

(72) Inventors: Wei Xiong, Madison, AL (US); Danny Pugh, Harvest, AL (US)

(73) Assignee: Universal Lighting Technologies, Inc., Madison, AL (US)

( * ) Notice: Subject to any disclaimer, the term of this patent is extended or adjusted under 35 U.S.C. 154(b) by 372 days.

(21) Appl. No.: 15/972,799

(22) Filed: May 7, 2018

Related U.S. Application Data

(60) Provisional application No. 62/622,362, filed on Jan. 26, 2018.

(51) Int. Cl.
*H02H 9/00* (2006.01)
*H02M 7/06* (2006.01)
*H01R 13/719* (2011.01)
*H03H 7/42* (2006.01)
*H02M 1/32* (2007.01)

(52) U.S. Cl.
CPC ........... *H02H 9/007* (2013.01); *H01R 13/719* (2013.01); *H02M 1/32* (2013.01); *H02M 7/06* (2013.01); *H03H 7/427* (2013.01)

(58) Field of Classification Search
None
See application file for complete search history.

(56) References Cited

U.S. PATENT DOCUMENTS

| | | | | |
|---|---|---|---|---|
| 5,251,120 A | * | 10/1993 | Smith | H03H 7/0115 |
| | | | | 363/126 |
| 2010/0165519 A1 | * | 7/2010 | Henson | H02H 9/001 |
| | | | | 361/18 |
| 2016/0241062 A1 | * | 8/2016 | Shau | H02J 7/02 |
| 2018/0091042 A1 | * | 3/2018 | Nicholson | H02M 3/158 |

\* cited by examiner

*Primary Examiner* — Jeffrey A Gblende
(74) *Attorney, Agent, or Firm* — Patterson Intellectual Property Law, P.C.; Gary L. Montle; Jerry Turner Sewell

(57) ABSTRACT

An electromagnetic interference (EMI) suppression circuit is interposed between an AC source and a DC power conversion system. The EMI suppression circuit includes a pi-type filter network having first and second filter input terminals and having first and second filter output terminals. The pi-type filter network includes a common mode choke and a differential mode choke between the input terminals and the output terminals. The pi-type filter network includes a first X-type capacitor across the first and second filter input terminals and includes a second X-type capacitor across the first and second filter output terminals. A first Y-type emission reduction capacitor is connected between the first filter input terminal and earth ground. At least a second Y-type emission reduction capacitor and a damping resistor are connected in series to form a series resistor-capacitor combination between the first filter output terminal and earth ground.

8 Claims, 8 Drawing Sheets

DAMPED PI-TYPE FILTER Y-TYPE CAPACITANCE NETWORK FOR RADIATED AND CONDUCTED EMISSION

CROSS-REFERENCE TO RELATED APPLICATION

This application claims benefit under 35 USC § 119(e) of U.S. Provisional Application No. 62/622,362 filed Jan. 26, 2018, entitled "A Damped Pi-Type Y Cap Network for Radiated and Conducted Emission Suppression."

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

FIELD OF THE INVENTION

The present disclosure relates generally to apparatuses and methods for suppressing electromagnetic interference (EMI) in electronic switching power supplies.

BACKGROUND OF THE INVENTION

Electronic switching power supplies are widely used in equipment requiring a DC voltage generated from an AC source. For example, light emitting diodes (LEDs) are DC devices that are now being commonly used to replace incandescent lights and fluorescent lights in homes, offices and other facilities. The LEDs are housed in devices that replace conventional incandescent and fluorescent lighting devices. Thus, the LED devices must receive power from the AC mains. Electronic switching power supplies are often used in LED devices to convert the AC input power to DC to operate the LEDs within the devices.

Because of the high frequency switching that occurs within an electronic switching power supply, EMI is generated across broad ranges of frequencies. Because EMI can interfere with communications equipment and with other sensitive electronic equipment, the Federal Communications Commission (FCC) imposes strict regulations on EMI generated by lighting equipment and other devices. In general, EMI regulations are directed to emissions in two areas: conducted emissions and radiated emissions, which are explained with respect to FIGS. 1 and 2.

FIG. 1 illustrates a topology of a typical conventional electronic switching power supply 100. The power supply includes three general blocks: an EMI control circuit 110, a rectifier circuit 112, and a power processing circuit 114. The power processing circuit provides power to a DC load 116, which may be, for example, a plurality of interconnected LEDs. AC power from an AC source 120 is provided across a line input 122 and a neutral input 124 of the EMI control circuit. In particular, the line input is connected to a conventional line conductor of the AC source, and the neutral input is connected to a conventional neutral conductor of the AC source. The connections may be accomplished by hard-wiring connections to the AC source or by inserting an AC plug into an AC outlet. As further shown in FIG. 1, the AC source is AC-coupled to a local earth ground connection 130 via a first parasitic coupling capacitor 132 representing the capacitive coupling between the line conductor and the neutral conductor to the earth ground conductor in a conventional AC wiring system.

The AC power passes through the EMI control circuit 110 and is provided across a first output terminal 140 and a second output terminal 142 of the EMI control circuit as conditioned AC power. The conditioned AC power across the first output terminal and the second output terminal of the EMI control circuit is provided across a first input 144 and a second input 146 of the rectifier circuit 112. The rectifier circuit is configured as a full-wave bridge rectifier circuit that comprises a first rectifier diode 150, a second rectifier diode 152, a third rectifier diode 154, and a fourth rectifier diode 156, which are connected as shown. The first output terminal of the EMI control circuit is connected to the cathode of the first rectifier diode and to the anode of the third rectifier diode. The second output terminal of the EMI control circuit is connected to the cathode of the second rectifier diode and to the anode of the fourth rectifier diode.

The anodes of the first rectifier diode 150 and the second rectifier diode 152 are commonly connected to a positive voltage (V+) output terminal 160 of the rectifier circuit 150. The cathodes of the third rectifier diode 154 and the fourth rectifier diode 156 are commonly connected to a reference voltage output terminal 162, which is connected to a local circuit ground connection 164. The positive voltage is provided as an unregulated DC voltage to a positive input terminal 170 of the power processing circuit 114. The reference voltage (circuit ground) is provided to a reference voltage (−) input terminal 172 of the power processing circuit.

The power processing circuit 114 operates in a conventional manner to convert the unregulated DC voltage to a regulated voltage or to a regulated current, which is provided to the load 116 via a first power processing circuit output terminal 174 and a second power processing circuit output terminal 176. In certain applications, the voltage is controlled to maintain a constant voltage applied to the load. In other applications, such as for example, LED lighting, the current is controlled to maintain a constant current through the load. In the example of FIG. 1, the power processing circuit is a switch-mode power supply, which may also be referred to as an electronic switching power supply. The switch-mode power supply operates by generating a high frequency switched DC signal having a variable duty cycle or a variable pulse width. The duty cycle or pulse width of the switched DC signal is controlled via feedback techniques to generate a selected output voltage (or a selected output current). The high frequency switching generates high frequency noise that should be suppressed to inhibit the noise from being conducted to the AC line and neutral conductors and from being radiated from the power supply 100.

As further shown in FIG. 1, the conventional EMI control circuit 110 comprises a first magnetic bead 200 and a second magnetic bead 202, a pi-type filter 204, a first Y-type capacitor 206 and a second Y-type capacitor 208. The pi-type filter has a first filter input node 210, a second filter input node 212, a first filter output node 214, and a second filter output node 216.

The first magnetic bead 200 has a first terminal connected to the line input terminal 122 of the EMI control circuit and has a second terminal connected to the first filter input node 210. The second magnetic bead has a first terminal connected to the neutral input terminal 124 of the EMI control circuit and has a second terminal connected to the second filter input node 212. The first Y-type capacitor 206 has a first terminal connected to the first filter output node 214 and has a second terminal connected to the local earth ground connection 130. The second Y-type capacitor 208 has a first terminal connected to the second filter output node 216 and has a second terminal connected to the local earth ground connection 130.

The pi-type filter 204 includes a first X-type capacitor 240 connected between the first filter input node 210 and the second filter input node 212. The pi-type filter also includes a second X-type capacitor 242 connected between the first filter output node 214 and the second filter output node 216.

The pi-type filter 204 includes a common mode choke 250. The common mode choke has a first terminal 252, a second terminal 254, a third terminal 256, and a fourth terminal 258. The common mode choke has a common core 260. A first winding 262 is wound onto the common core between the first terminal and the second terminal. A second winding 264 is wound onto the common core between the third terminal and the fourth terminal.

The second terminal 254 of the common mode choke 250 is connected to a first terminal 272 of a differential mode choke 270. The differential mode choke has a second terminal 274. A single winding 276 is wound onto a core 278 between the first terminal and the second terminal of the differential mode choke.

The first filter output node 214 is connected to the second terminal 274 of the differential mode choke 270. The second filter output node 216 is connected directly to the fourth terminal 258 of the common mode choke 250. As known in the art, the common mode choke provides a high common mode impedance with respect to EMI common to the signal lines connected to the line conductor and to the neutral conductor of the AC source 120. The differential mode choke suppresses differential noise in the power supply 100.

The EMI generated by the high frequency switching within the power processing circuit 214 comprises two types of emissions that appear on the lines leading back to the AC source 120: conducted emissions and radiated emissions. The conducted emissions include common mode emissions that have similar effects on both the line voltage and the neutral voltage of the AC source and include differential emissions that have differential effects on the line voltage and the neutral voltage. The pi-type filter 204 operates as a differential noise filter that suppresses the conducted differential emissions. The first Y-type capacitor 206 and the second Y-type capacitor 208 suppress the common mode conducted emissions. The first magnetic bead 200 and the second magnetic bead 202 suppress the radiated emissions.

The effect of the noise generated by the power processing circuit 114 in FIG. 1 can be understood with respect to FIG. 2, which illustrates the EMI control circuit 110 of FIG. 1 connected to a simplified equivalent noise generation circuit 300. The simplified equivalent noise generation circuit 300 replaces the rectifier circuit 112 and the power processing circuit 114 of FIG. 1 and is connected to the first output terminal 140 and the second output terminal 142 of the EMI control circuit. The noise generation circuit includes a first equivalent AC voltage source 310 connected between the first output terminal and the second output terminal of the EMI control circuit. The first equivalent AC voltage source represents the differential noise generated by the rectifier circuit and the power processing circuit between the line voltage and the neutral voltage coupled to the AC source 120. The "signal" generated by the first equivalent AC voltage source is identified as $V_{DN}$ ($V_{Differential\_Noise}$). The differential mode noise represented by the first equivalent AC voltage source is typically generated by high di/dt (e.g., rapid current changes) during switching.

The first output terminal 140 of the EMI control circuit 110 is capacitively coupled to a first terminal 322 of a second equivalent AC voltage source 320 via a second parasitic coupling capacitor 324. The second output terminal 142 of the EMI control circuit is capacitively coupled to the first terminal of the second equivalent AC voltage source via a third parasitic coupling capacitor 326. A second terminal 328 of the second equivalent AC voltage source is connected to the local earth ground connection 130. The second equivalent AC voltage source represents the common mode noise generated by the rectifier circuit 112 and the power processing circuit 114 that is coupled in common to the line voltage and the neutral voltage of the AC source 120. The "signal" generated by the second equivalent AC voltage source is identified as $V_{CN}$ ($V_{Common\_Noise}$). The common mode noise represented by the second equivalent AC voltage source is typically generated by high dv/dt (e.g., rapid voltage changes) during switching.

The differential mode noise "generated" by the first equivalent AC source 310 in FIG. 2 circulates between the line conductor and the neutral conductor. The common mode noise "generated" by the second equivalent AC voltage source 320 circulates to and from the AC source 120 with respect to both the line conductor and the neutral conductor via the first parasitic coupling capacitor 132 between the AC source and the local earth ground connection 130 and via the second parasitic coupling capacitor 324 and the third parasitic coupling capacitor 326.

The first Y-type capacitor 206 and the second Y-type capacitor 208 bypass a substantial portion of the common mode noise on the line conductor and the neutral conductor, respectively, to the earth ground connection 130 to substantially reduce the common mode noise reaching the AC source 120. The common mode choke 250 further reduces the common mode noise reaching the AC source. Common mode noise is also a major contributor to radiated noise emission. The first magnetic bead 200 and the second magnetic bead 202 are located near the connections to the AC source to further suppress radiated emission from reaching the AC source.

A substantial portion of the differential noise on the line conductor and the neutral conductor is bypassed to the earth ground connection 130 by the first X-type capacitor 240 and the second X-type capacitor 242 and is blocked by the differential choke 270.

SUMMARY OF THE INVENTION

The conventional EMI control circuit 110 illustrated in FIGS. 1-3 works well in most applications; however, the first and second magnetic beads 200, 202 used to further suppress the radiated common mode noise are expensive, occupy significant area on a printed circuit board, and require additional steps to install. Accordingly, a need exists for an EMI control circuit that does not require magnetic beads or similar devices to suppress radiated common mode noise.

An aspect of the embodiments disclosed herein is an electromagnetic interference (EMI) suppression circuit interposed between an AC source and a DC power conversion system. The EMI suppression circuit includes a pi-type filter network having first and second filter input terminals and having first and second filter output terminals. The pi-type filter network includes a common mode choke and a differential mode choke between the input terminals and the output terminals. The pi-type filter network includes a first X-type capacitor across the first and second filter input terminals and includes a second X-type capacitor across the first and second filter output terminals. A first Y-type emission reduction capacitor is connected between the first filter input terminal and earth ground. At least a second Y-type emission reduction capacitor and a damping resistor are connected in series to form a series resistor-capacitor combination between the first filter output terminal and earth ground.

One aspect of the embodiments disclosed herein is an electromagnetic interference (EMI) suppression circuit interposed between an AC source and a DC power conversion system. The AC source provides an AC voltage on a line conductor with respect to a neutral conductor. The EMI suppression circuit comprises a pi-type filter network having a first filter input terminal and a second filter input terminal. The first filter input terminal is configured to connect to the line conductor of the AC source. The second filter input terminal is configured to connect to the neutral conductor of the AC source. The pi-type filter network has a first filter output terminal and a second filter output terminal. The first and second filter output terminals are configured to provide an AC voltage across a first power conversion system input terminal and a second power conversion input terminal of the DC power conversion system. The EMI suppression circuit further comprises a first emission reduction capacitor having a first terminal connected to the first filter input terminal of the pi-type filter network and having a second terminal connected to an earth ground connection. The EMI suppression circuit further comprises at least a second emission reduction capacitor and a damping resistor connected in series to form a series resistor-capacitor combination. The series resistor-capacitor combination has a first terminal connected to the first filter output terminal. The series resistor-capacitor combination has a second terminal connected to the earth ground connection.

In certain embodiments in accordance with this aspect, the pi-type filter network comprises a first X-type capacitor having a first terminal connected to the first filter input terminal and having a second terminal connected to the second filter input terminal. The pi-type filter network further comprises a common mode choke having a first common mode choke input terminal connected to the first filter input terminal and having a second common mode choke input terminal connected to the second filter input terminal. The common mode choke has a first common mode choke output terminal coupled to the first common mode input terminal via a first common mode choke winding. The common mode choke has a second common mode choke output terminal coupled to the second common mode input terminal via a second common mode choke winding. The first and second common mode choke windings are wound onto a common core. The pi-type filter network further includes a differential mode choke having a first terminal connected to the first common mode choke output terminal and having a second terminal connected to the first filter output terminal. The pi-type filter network further includes a second X-type capacitor having a first terminal connected to the first filter output terminal and having a second terminal connected to the second filter output terminal.

In certain embodiments in accordance with this aspect, the second emission reduction capacitor is connected between the first filter output terminal and a first terminal of the damping resistor. A second terminal of the damping resistor is connected to the earth ground connection. A third emission reduction capacitor is connected between the second filter output terminal and the first terminal of the damping resistor.

In certain embodiments in accordance with this aspect, the damping resistor suppresses oscillations within the pi-type network, the first emission reduction capacitor and the second emission reduction capacitor.

In certain embodiments in accordance with this aspect, the DC power conversion system comprises a rectifier circuit coupled to the first and second filter output terminals. The rectifier circuit generates an unregulated DC output voltage. The DC power conversion system further comprises a power processing circuit that receives the unregulated DC output voltage from the rectifier circuit and that generates a regulated DC voltage.

In certain embodiments in accordance with this aspect, the regulated DC voltage is coupled to a DC load.

Another aspect of the embodiments disclosed herein is electromagnetic interference (EMI) suppression circuit interposed between an AC source and a DC power conversion system. The AC source provides an AC voltage on a line conductor with respect to a neutral conductor. The EMI suppression circuit comprises a pi-type filter network having a first filter input terminal and a second filter input terminal. The first filter input terminal is configured to connect to the line conductor of the AC source. The second filter input terminal is configured to connect to the neutral conductor of the AC source. The pi-type filter network has a first filter output terminal and a second filter output terminal. The first and second filter output terminals are configured to provide an AC voltage across a first power conversion system input terminal and a second power conversion input terminal of the DC power conversion system. A first emission reduction capacitor has a first terminal connected to the first filter input terminal of the pi-type filter network and has a second terminal connected to an earth ground connection. At least a second emission reduction capacitor and a damping resistor are connected in series to form a series resistor-capacitor combination. The series resistor capacitor combination has a first terminal connected to the first filter output terminal. The series resistor-capacitor combination has a second terminal connected to the earth ground connection.

In certain embodiments in accordance with this aspect, the second emission reduction capacitor is connected between the first filter output terminal and a first terminal of the damping resistor. A second terminal of the damping resistor is connected to the earth ground connection. A third emission reduction capacitor is connected between the second filter output terminal and the first terminal of the damping resistor.

In certain embodiments in accordance with this aspect, the damping resistor suppresses oscillations within the pi-type network, the first emission reduction capacitor and the second emission reduction capacitor.

Another aspect of the embodiments disclosed herein is a method of suppressing electromagnetic interference (EMI) from a DC power conversion system coupled back to an AC source that provides an AC voltage on a line conductor with respect to a neutral conductor. The method comprises interposing a pi-type filter network between the AC source and the DC power conversion system. The pi-type filter has a first filter input terminal and a second filter input terminal coupled to the AC source. The pi-type filter has a first filter output terminal and a second filter output terminal coupled to the DC power conversion system. The method further comprises inserting a first emission reduction capacitor between the first filter input terminal of the pi-type filter network and an earth ground connection. The method further comprises inserting at least a second emission reduction capacitor and a damping resistor in series between the first filter output terminal and the earth ground connection.

In certain embodiments in accordance with this aspect, the damping resistor suppresses oscillations within the pi-type network, the first emission reduction capacitor and the second emission reduction capacitor.

BRIEF DESCRIPTIONS OF THE SEVERAL VIEWS OF THE DRAWINGS

DETAILED DESCRIPTION OF THE INVENTION

Reference will now be made in detail to embodiments of the present disclosure, one or more drawings of which are set forth herein. Each drawing is provided by way of explanation of the present disclosure and is not a limitation. It will be apparent to those skilled in the art that various modifications and variations can be made to the teachings of the present disclosure without departing from the scope of the disclosure. For instance, features illustrated or described as part of one embodiment can be used with another embodiment to yield a still further embodiment.

It is intended that the present disclosure covers such modifications and variations as come within the scope of the appended claims and their equivalents. Other objects, features, and aspects of the present disclosure are disclosed in the following detailed description. It is to be understood by one of ordinary skill in the art that the present discussion is a description of exemplary embodiments only and is not intended as limiting the broader aspects of the present disclosure.

Figure 1:
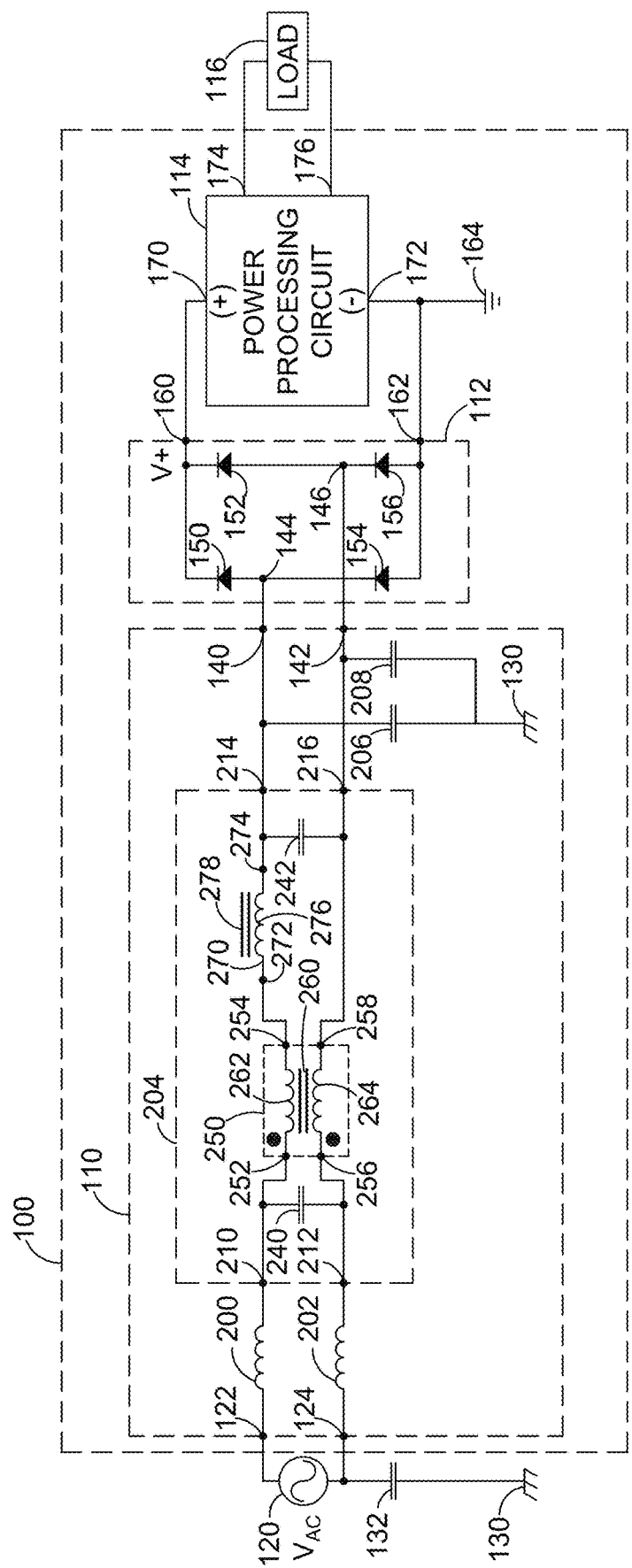
FIG. 1 illustrates a circuit topology for a conventional electronic switching power supply that generates DC power from an AC source, the topology including an EMI control circuit to reduce emissions of common mode noise and differential mode noise generated by a rectifier circuit and a power processing circuit.
Figure 2:
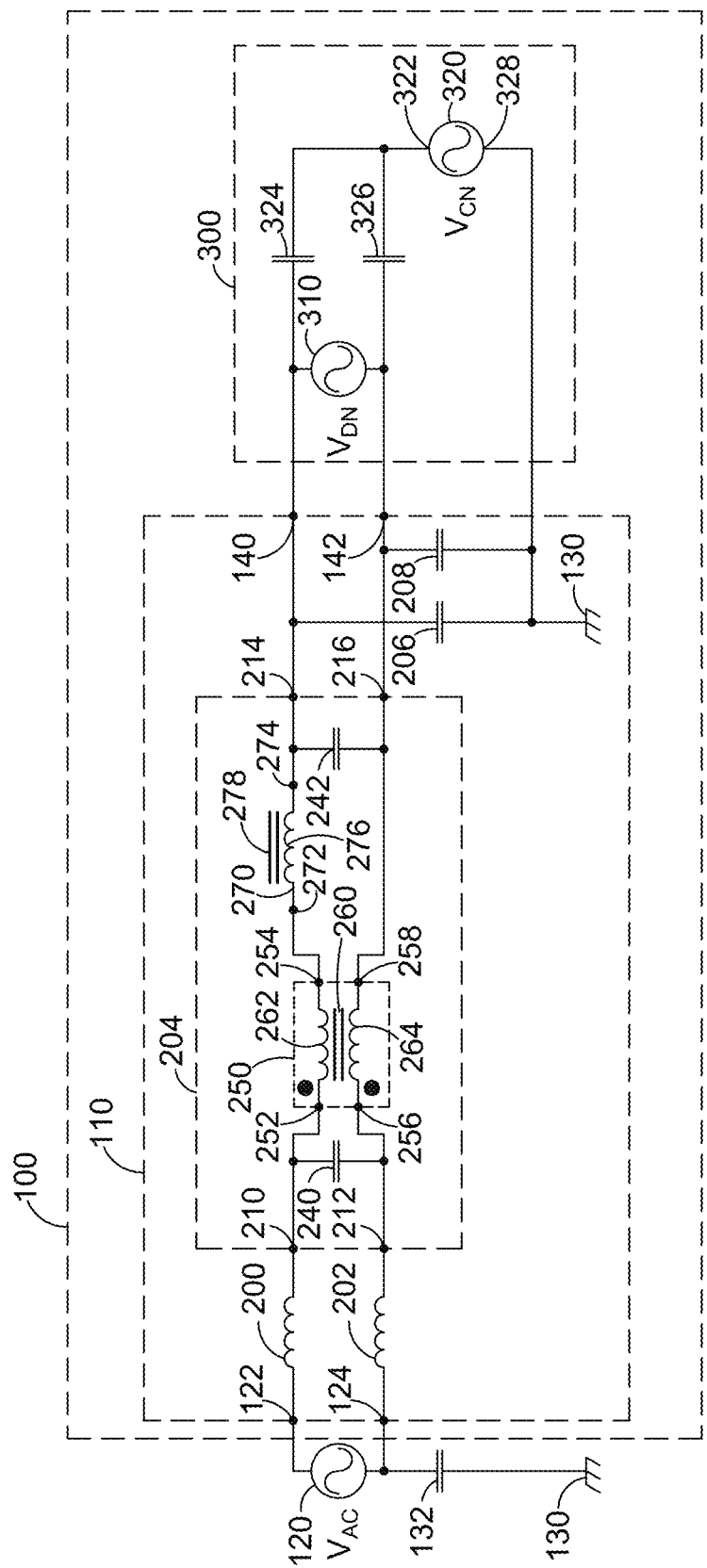
FIG. 2 illustrates a schematic diagram of the conventional electronic switching power supply FIG. 1 with the rectifier circuit and the power processing circuit replaced with a simplified equivalent noise generation circuit that generates common mode noise and differential mode noise directed toward the EMI control circuit.
Figure 3:
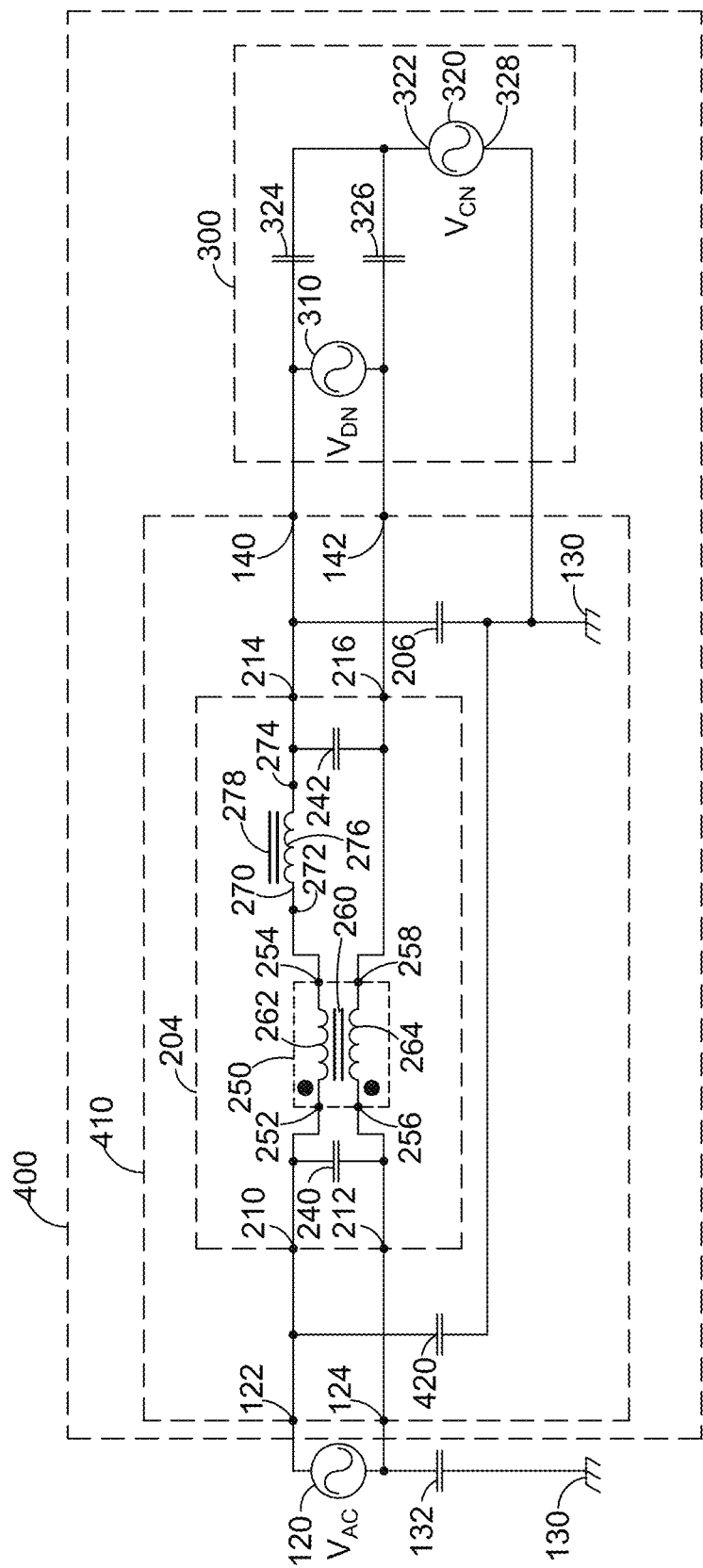
FIG. 3 illustrates a schematic diagram similar to the diagram of FIG. 2 wherein the magnetic beads coupling the EMI control circuit to the AC source are removed, and wherein an additional Y-type capacitor is inserted between a first input terminal of the EMI control circuit and a local earth ground connection.

FIG. 3 illustrates an electronic switching power supply circuit 400 generally corresponding to FIG. 2. As in FIG. 2, the rectifier circuit 112, the power processing circuit 114, and the load 116 of FIG. 1 are again replaced with the simplified equivalent noise generation circuit 300 of FIG. 2. In FIG. 3, the conventional EMI control circuit 110 of FIGS. 1 and 2 is replaced with an improved EMI control circuit 410. The improved EMI control circuit of FIG. 3 is similar to the previously described EMI control circuit of FIGS. 1 and 2; and like elements are numbered as before. Unlike the previously described EMI control circuit of FIGS. 1 and 2, the improved EMI control circuit of FIG. 3 no longer includes the expensive magnetic beads 200, 202. Rather, the first filter input node 210 of the pi-type filter 204 is connected directly to the line input terminal 122, which is coupled to the line conductor of the AC source 120. The second filter input node 212 of the pi-type filter is connected directly to the neutral input terminal 124, which is coupled to the neutral conductor of the AC source. A single Y-type capacitor 420 is connected from the first filter input terminal (e.g., from the line of the AC source) to the local earth ground connection 130. The single Y-type capacitor connected to the line of the AC source functions to further bypass the radiated common mode noise before the noise reaches the line conductor and the neutral conductor of the AC source. Only a single Y-type capacitor is needed because the first X-type capacitor 240 in the pi-type filter 204 is connected directly between the line conductor and the neutral conductor. Thus, the neutral conductor is also effectively capacitively coupled to the local earth ground connection via the first X-type capacitor and the additional single Y-type capacitor. Accordingly, the additional single Y-type capacitor bypasses common mode noise to the local earth ground connection from both the line voltage and the neutral voltage within the EMI control circuit.

As further illustrated in FIG. 3, the second Y-type capacitor 208 connected between the second filter output node 216 and the local earth ground connection 130 in FIGS. 1 and 2 may also be eliminated because the second X-type capacitor 242 in the pi-type filter 204 also effectively capacitively couples the second filter output node to the local earth ground connection via the first Y-type capacitor 206. The first Y-type capacitor bypasses a substantial portion of the common mode noise on both the line and the neutral before the noise reaches the common mode choke 250 within the pi-type filter.

Figure 4:
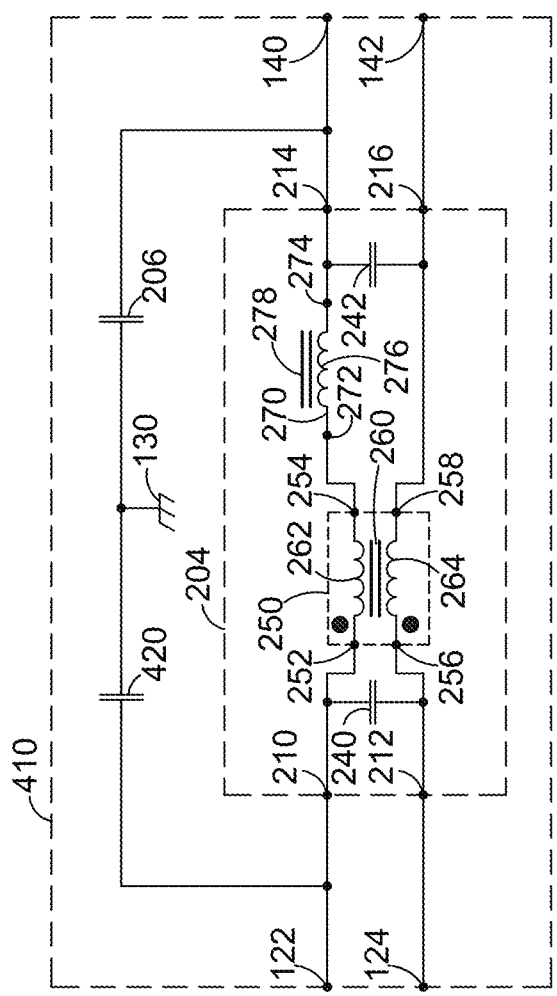
FIG. 4 illustrates the EMI control circuit of FIG. 3 with the components connected as in FIG. 3 but with the components repositioned graphically to emphasize the parallel configuration of the Y-type capacitors with respect to the pi-type filter.

FIG. 4 illustrates only the EMI control circuit 410 of FIG. 3. As in FIG. 3, the EMI control circuit in FIG. 4 includes the pi-type filter 204 with the additional Y-type capacitor 420 connected between the first filter input node 210 and the earth ground connection 130. The first Y-type capacitor 206 is connected between the first filter output node 214 and the earth ground connection as described above. As illustrated in FIG. 4, the two Y-type capacitors are electrically equivalently connected in parallel with the common mode choke 250 and the differential mode choke 270. The two capacitors are repositioned in FIG. 4 to emphasize the parallel configuration; however, the two capacitors remain electrically connected to the respective nodes of the pi-type filter as in FIG. 3. The parallel circuit formed by the two capacitors and the two chokes may oscillate over a certain range of frequencies. The oscillations may increase the noise generated by the overall circuit rather than decrease the noise as desired.

Figure 5:
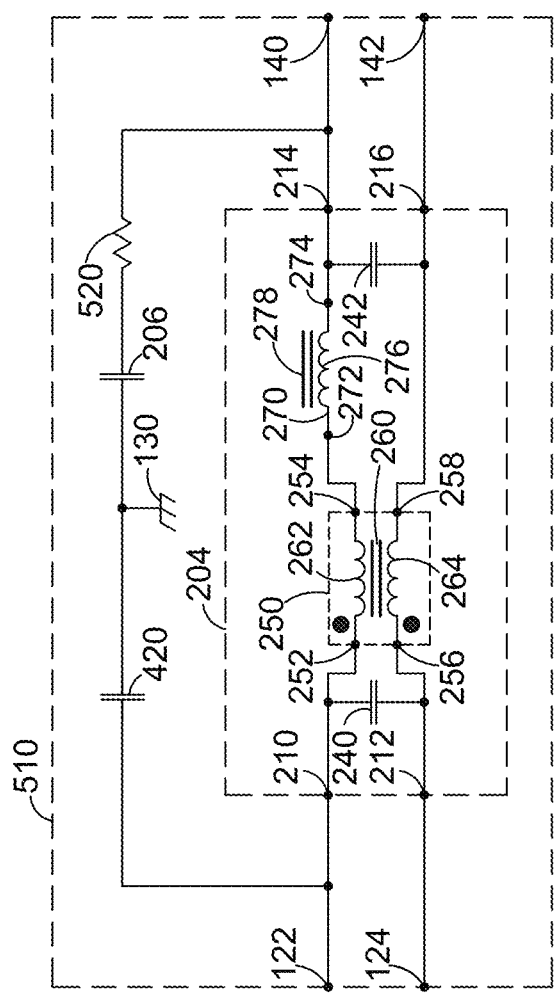
FIG. 5 illustrates the EMI control circuit of FIG. 4 modified to include a damping resistor in series with the Y-type capacitor between the first output terminal of the pi-type filter and the local earth ground connection.

FIG. 5 illustrates a further modification of the circuit of FIG. 4 as an EMI control circuit 510 in which a damping resistor 520 is inserted in series between the first Y-type capacitor 206 and the first filter output node 214 of the pi-type filter 204. The damping resistor damps oscillations that may occur at certain frequencies. The resistance of the damping resistor may range from 10 ohms to 1,000 ohms. The resistance is selected in accordance with the capacitance of the first Y-type capacitor 206.

In FIG. 5, the damping resistor 520 is inserted in series with the first Y-type capacitor 206 at the first filter output node 214 of the pi-type filter 204 because the primary function of the first Y-type capacitor is to bypass the relatively low frequency common mode noise in a 9 kHz to 30 MHz range to the local earth ground connection 130. In contrast, the primary function of the additional Y-type capacitor 420 connected to the first filter input node 210 of the pi-type filter is to bypass the relatively high frequency radiated emission noise in a 30 MHz to 1 GHz range. In order to bypass a substantial portion of the relatively high frequency noise to the local earth ground connection, the path from the first filter input node 210 to the earth ground must have a very low impedance, thus precluding the insertion of a damping resistor in series with the additional Y-type capacitor. The values of the damping resistance, the capacitances, and the inductances are selected in accordance with the frequencies and the magnitudes of the radiated and conducted emissions encountered in a particular configuration of the components on a printed circuit board.

The damped pi-type network with the two Y-type capacitances 206, 420 to the local earth ground connection 130 on the first filter input node 210 and the first filter output node 214 of the pi-type network 204 allow the conducted emission and the radiated emission to be controlled separately. As described herein, the additional Y-type capacitor 420 connected between the first filter input node 210 and the local earth ground connection 130 is mainly used to control radiated emission. The other circuit elements are mainly used to control conducted emission. This separation in control of the two forms of emissions enables the control of EMI to be implemented easily. For example, if the radiated emission is too great, the capacitance value of the additional Y-type capacitor is selectable to reduce the radiated emission. If the conducted emission is too great, the resistance of the damping resistor 520, the capacitance of the first Y-type capacitor 206, the inductance of the differential mode choke 270, the inductance of the common mode choke 250, the capacitance of the first X-type capacitor 240 and the capacitance of the second X-type capacitor 242 can be selected to reduce the conducted emission.

Figure 6:
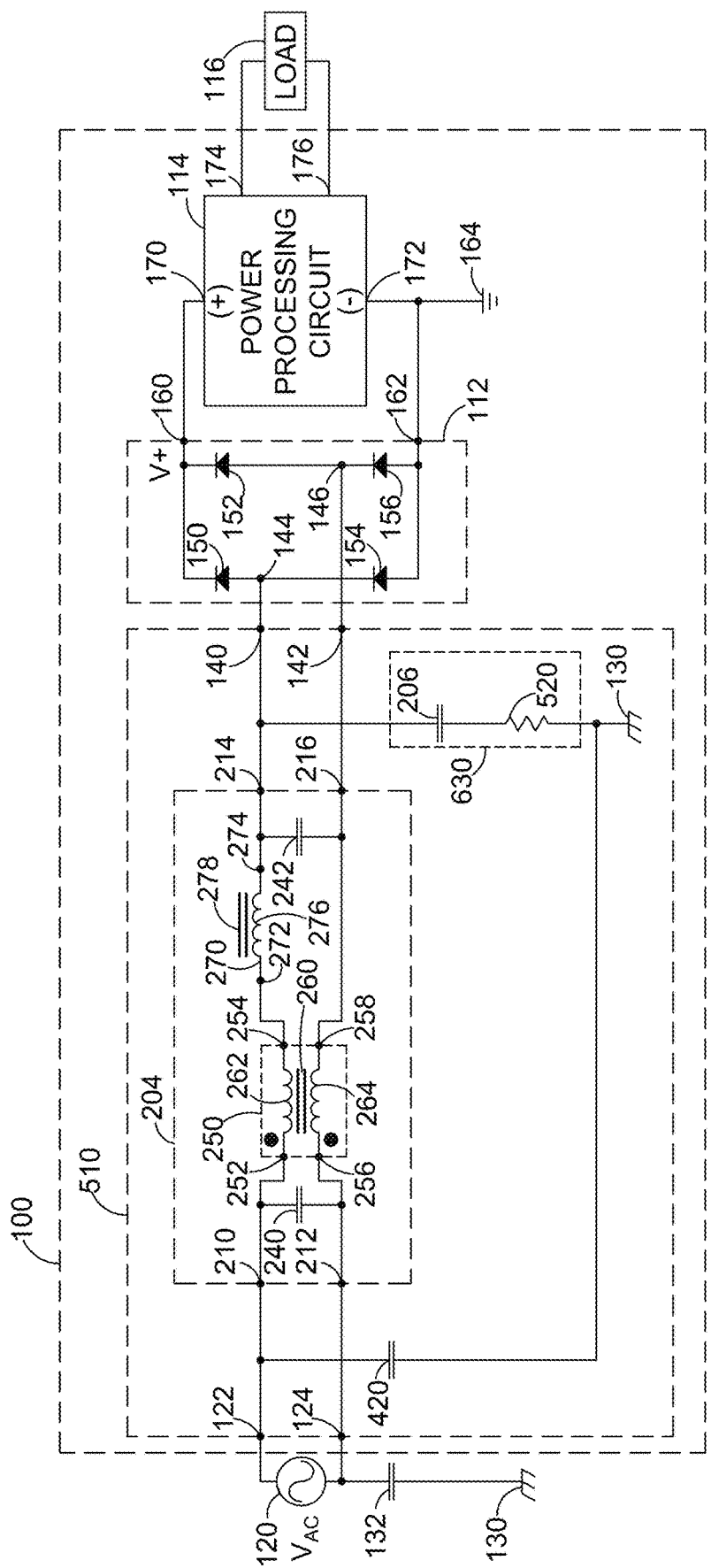
FIG. 6 illustrates a first implementation of the improved EMI control circuit of FIG. 5 in combination with the rectifier circuit and the power processing circuit of FIG. 1.

FIG. 6 illustrates a first implementation of the EMI control circuit 510 of FIG. 5 in combination with the rectifier circuit 112, the power processing circuit 114, and the load 116. The implementation in FIG. 6 includes the damping resistor 520 positioned in series with the first Y-type capacitor 206 to form a series resistor-capacitor network 630 between the first filter output node 214 and the earth ground connection 130 as described above. In FIG. 6, the first Y-type capacitor is connected to the first filter output node, and the damping resistor is connected to the earth ground connection. The series capacitor network may also be implemented with the damping resistor connected to the first filter output node and with the first Y-type capacitor connected to the earth ground connection.

Figure 7:
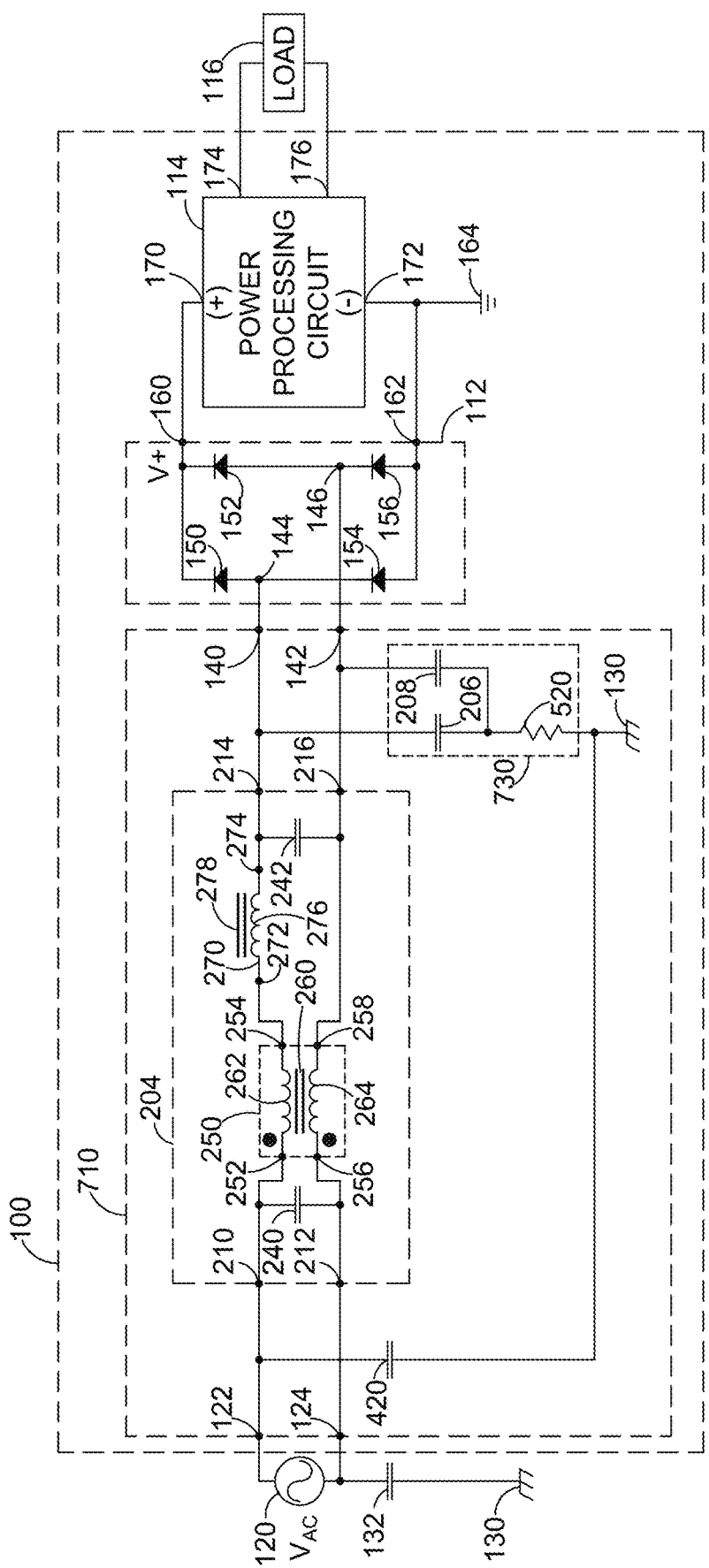
FIG. 7 illustrates a second implementation of the improved EMI control circuit as in FIG. 6 with the further modification of an additional Y-type capacitor between the second output node of the pi-type filter and the damping resistor.

FIG. 7 illustrates a second implementation of a further modified EMI control circuit 710 in combination with the rectifier circuit 112, the power processing circuit 114, and the load 116. The implementation of FIG. 7 includes a modified resistor-capacitor network 730. In the modified resistor-capacitor network, a first terminal of the first Y-type capacitor 206 is connected to the first filter output node 214. The first terminal of the second Y-type capacitor 208 is connected to the second filter output node 216 as shown in FIG. 1. The respective second terminals of the first Y-type capacitor and the second Y-type capacitor are connected to a first terminal of the previously described common damping resistor 520. A second terminal of the common damping resistor is connected to the local earth ground connection 130.

Figure 8:
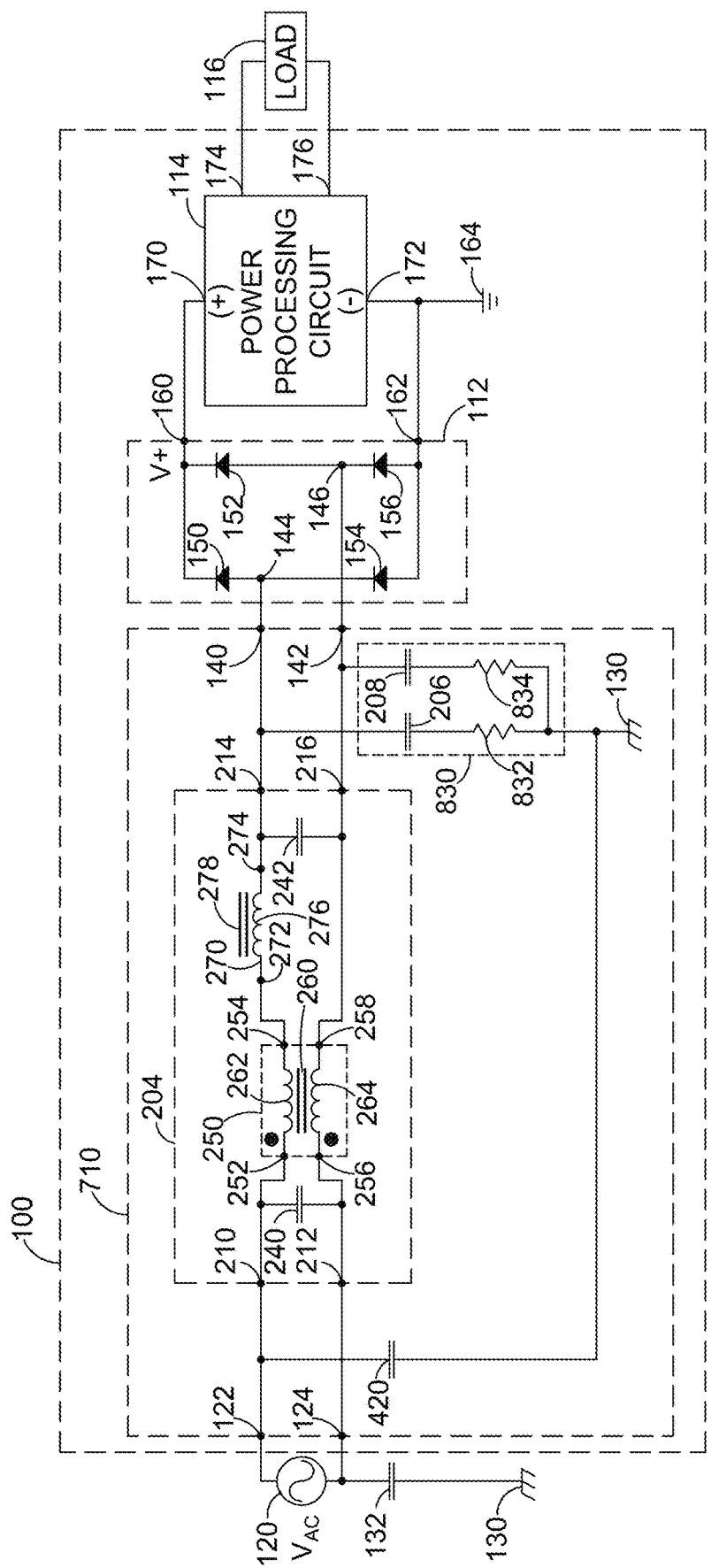
FIG. 8 illustrates a third implementation of the improved EMI control circuit as in FIG. 7 with the further modification of including a respective damping resistor in series with each of the Y-type capacitors connected between the output nodes of the pi-type filter and the earth ground connection.

FIG. 8 illustrates a further modified resistor-capacitor network 830. In FIG. 8, the common damping resistor 520 of FIG. 7 is replaced with a first damping resistor 832 and a second damping resistor 834. The first damping resistor is connected in series with the first Y-type capacitor 206 between the first filter output node 214 and the local earth ground connection 130. The second damping resistor is connected in series with the second Y-type capacitor 208 between the second filter output node 216 and the local earth ground connection.

Thus, although there have been described particular embodiments of the present invention of a new and useful "A Damped Pi-Type Filter Y-Type Capacitance Network for Radiated and Conducted Emission Suppression," it is not intended that such references be construed as limitations upon the scope of this invention except as set forth in the following claims.

We claim:

1. An electromagnetic interference (EMI) suppression circuit interposed between an AC source and a DC power conversion system, the AC source providing an AC voltage on a line conductor with respect to a neutral conductor, the EMI suppression circuit comprising:
    a pi-type filter network having a first filter input terminal and a second filter input terminal, the first filter input terminal configured to connect to the line conductor of the AC source, the second filter input terminal configured to connect to the neutral conductor of the AC source, the pi-type filter network having a first filter output terminal and a second filter output terminal, the first and second filter output terminals configured to provide an AC voltage across a first power conversion system input terminal and a second power conversion input terminal of the DC power conversion system;
    a first emission reduction capacitor having a first terminal connected to the first filter input terminal of the pi-type filter network and having a second terminal connected to an earth ground connection; and
    at least a second emission reduction capacitor and a damping resistor connected in series to form a series resistor-capacitor combination, the series resistor-capacitor combination having a first terminal connected to the first filter output terminal, the series resistor-capacitor combination having a second terminal connected to the earth ground connection.

2. The EMI suppression circuit of claim 1, wherein the pi-type filter network comprises:
    a first X-type capacitor having a first terminal connected to the first filter input terminal and having a second terminal connected to the second filter input terminal;
    a common mode choke having a first common mode choke input terminal connected to the first filter input terminal and having a second common mode choke input terminal connected to the second filter input terminal, the common mode choke having a first common mode choke output terminal coupled to the first common mode input terminal via a first common mode choke winding, the common mode choke having a second common mode choke output terminal coupled to the second common mode input terminal via a second common mode choke winding, the first and second common mode choke windings wound onto a common core;

a differential mode choke having a first terminal connected to the first common mode choke output terminal and having a second terminal connected to the first filter output terminal; and a second X-type capacitor having a first terminal connected to the first filter output terminal and having a second terminal connected to the second filter output terminal.

3. The EMI suppression circuit of claim 1, wherein:

the second emission reduction capacitor is connected between the first filter output terminal and a first terminal of the damping resistor, and wherein a second terminal of the damping resistor is connected to the earth ground connection; and a third emission reduction capacitor is connected between the second filter output terminal and the first terminal of the damping resistor.

4. The EMI suppression circuit of claim 1, wherein the damping resistor suppresses oscillations within the pi-type network, the first emission reduction capacitor and the second emission reduction capacitor.

5. The EMI suppression circuit of claim 1, wherein the DC power conversion system comprises:

a rectifier circuit coupled to the first and second filter output terminals, the rectifier circuit generating an unregulated DC output voltage; and a power processing circuit that receives the unregulated DC output voltage from the rectifier circuit and that generates a regulated DC voltage.

6. The EMI suppression circuit of claim 1, wherein the regulated DC voltage is coupled to a DC load.

7. A method of suppressing electromagnetic interference (EMI) from a DC power conversion system coupled back to an AC source that provides an AC voltage on a line conductor with respect to a neutral conductor, the method comprising:

interposing a pi-type filter network between the AC source and the DC power conversion system, the pi-type filter having a first filter input terminal and a second filter input terminal coupled to the AC source and having a first filter output terminal and a second filter output terminal coupled to the DC power conversion system;

inserting a first emission reduction capacitor between the first filter input terminal of the pi-type filter network and an earth ground connection; and inserting at least a second emission reduction capacitor and a damping resistor in series between the first filter output terminal and the earth ground connection.

8. The method of claim 7, wherein the damping resistor suppresses oscillations within the pi-type network, the first emission reduction capacitor and the second emission reduction capacitor.

* * * * *